United States Patent
Frissen et al.

(10) Patent No.: US 6,879,063 B2
(45) Date of Patent: Apr. 12, 2005

(54) DISPLACEMENT DEVICE

(75) Inventors: Petrus C.M. Frissen, Eindhoven (NL); Johan C. Compter, Eindhoven (NL); Antonius T.A. Peijnenburg, Eindhoven (NL); Erik R. Loopstra, Heeze (NL)

(73) Assignees: ASML Netherlands B.V. (NL); Koninklijke Philips Electronics, N.V. (NL)

(*) Notice: Subject to any disclaimer, the term of this patent is extended or adjusted under 35 U.S.C. 154(b) by 0 days.

(21) Appl. No.: 10/382,819

(22) Filed: Mar. 6, 2003

(65) Prior Publication Data

US 2003/0155821 A1 Aug. 21, 2003

Related U.S. Application Data

(63) Continuation of application No. 09/652,966, filed on Aug. 31, 2000, now Pat. No. 6,531,793.

(30) Foreign Application Priority Data

Sep. 2, 1999 (EP) .............................................. 99202847

(51) Int. Cl.[7] .............................................. H02K 41/00
(52) U.S. Cl. ........................... 310/12; 414/935; 310/13
(58) Field of Search .............................. 310/156, 12–15, 310/17; 414/935; 250/492.1, 492.2

(56) References Cited

U.S. PATENT DOCUMENTS

| | | | |
|---|---|---|---|
| 4,518,918 A | 5/1985 | Avery .......................... 324/208 |
| 4,535,278 A | 8/1985 | Asakawa ..................... 318/687 |
| 4,647,802 A | 3/1987 | Konecny .................. 310/49 R |
| 4,654,571 A | 3/1987 | Hinds .......................... 318/687 |
| 4,667,139 A | 5/1987 | Hirai et al. .................. 318/687 |
| 4,893,071 A | 1/1990 | Miller ......................... 324/660 |
| 4,949,043 A | 8/1990 | Hillenbrand ................ 324/320 |
| 5,084,959 A | 2/1992 | Ando et al. .................... 29/740 |
| 5,157,296 A | 10/1992 | Trumper ..................... 310/90.5 |
| 5,196,745 A | 3/1993 | Trumper ....................... 310/12 |
| 5,294,854 A | 3/1994 | Trumper ..................... 310/90.5 |
| 5,334,892 A | 8/1994 | Chitayat ....................... 310/12 |
| 5,631,618 A | 5/1997 | Trumper et al. ............ 335/299 |
| 5,699,621 A | 12/1997 | Trumper et al. ............. 33/1 M |
| 5,723,917 A | 3/1998 | Chitayat ....................... 310/12 |
| 5,777,402 A | 7/1998 | Chitayat ....................... 310/12 |
| 5,841,207 A | 11/1998 | Correns et al. ............... 310/12 |
| 5,844,666 A | 12/1998 | Van Engelen et al. ........ 310/12 |
| 5,847,480 A | 12/1998 | Post .......................... 310/90.5 |
| 5,886,432 A | 3/1999 | Markle ........................ 310/12 |
| 5,925,956 A | 7/1999 | Ohzeki ...................... 310/90.5 |
| 6,003,230 A | 12/1999 | Trumper et al. ............. 33/1 M |
| 6,005,309 A | 12/1999 | Chitayat ....................... 310/12 |
| 6,025,658 A | 2/2000 | Kamata ........................ 310/12 |
| 6,066,998 A | 5/2000 | Trumper et al. ............. 335/229 |

(Continued)

FOREIGN PATENT DOCUMENTS

| | | |
|---|---|---|
| JP | 5-22924 | 1/1993 |
| JP | 5-57550 | 3/1993 |
| JP | 8-51756 | 2/1995 |

(Continued)

*Primary Examiner*—Burton Mullins
(74) *Attorney, Agent, or Firm*—Pillsbury Winthrop LLP

(57) ABSTRACT

A positioning device comprising a first part (1) which is movable relatively to a second part (2) in an X-direction and a Y-direction, said first part (1) comprising a carrier (5) on which a system of magnets (3) is arranged according to a pattern of rows (7) and columns (8) extending parallel to the X-direction and the Y-direction, respectively. The magnets in each row and column are arranged according to a Halbach array, i.e. the magnetic orientation of successive magnets in each row (7) and each column (8) rotates 90° counter-clockwise. The second part (2) comprises an electric coil system (4) with two types of electric coils ($C_1$, $C_2$), one type having an angular offset of +45°, and the other type having an offset of −45° with respect to the X-direction. The magnet configuration causes a very strong magnetic field.

71 Claims, 5 Drawing Sheets

U.S. PATENT DOCUMENTS

Figure 1:
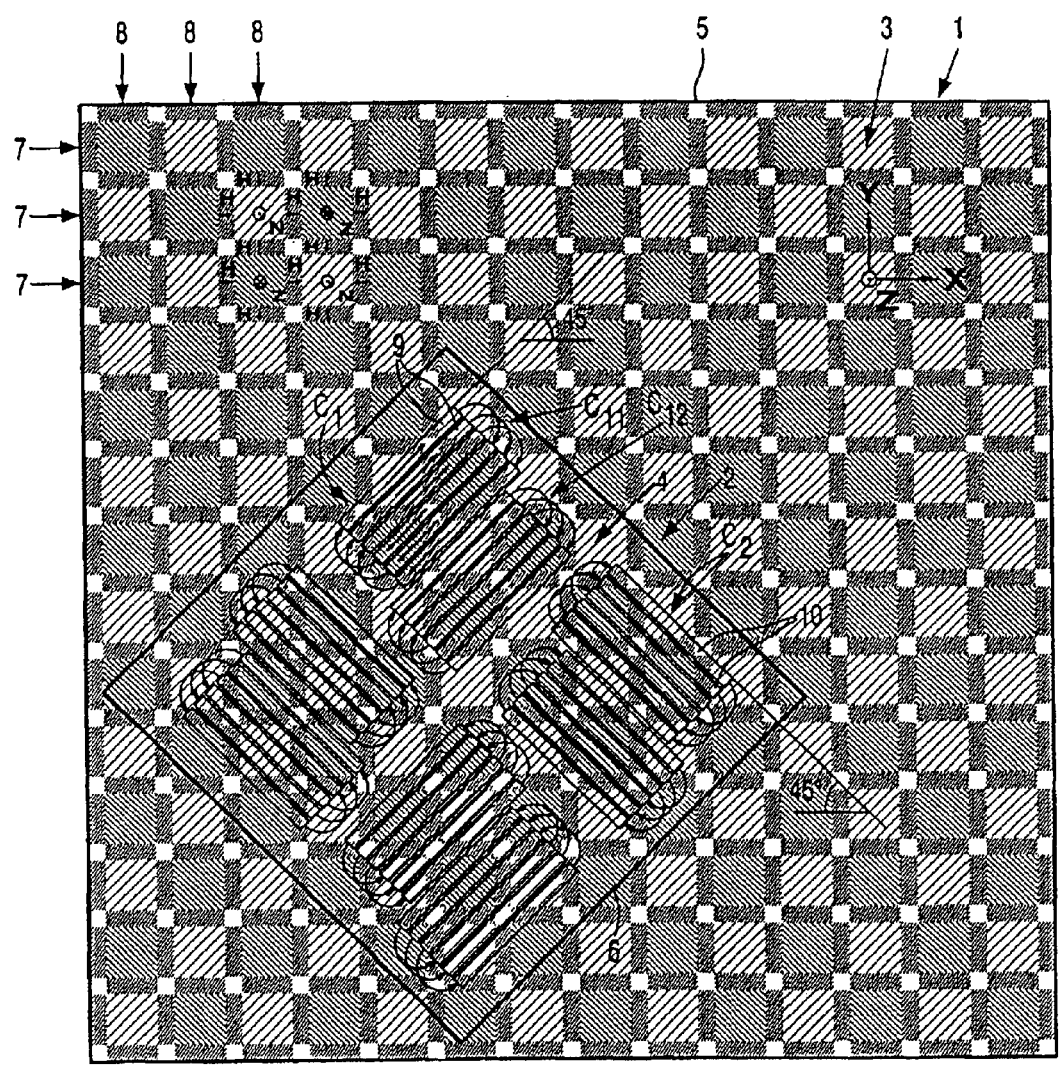

| | | | | |
|---|---|---|---|---|
| 6,069,418 | A | | 5/2000 | Tanaka .......................... 310/12 |
| 6,072,251 | A | * | 6/2000 | Markle ......................... 310/12 |
| 6,084,281 | A | | 7/2000 | Fullin et al. ................. 257/422 |
| 6,097,114 | A | | 8/2000 | Hazelton ..................... 310/12 |
| 6,104,108 | A | * | 8/2000 | Hazelton et al. .............. 310/12 |
| 6,104,269 | A | | 8/2000 | Chkitayat ................... 335/284 |
| 6,114,781 | A | | 9/2000 | Hazelton et al. .............. 310/12 |
| 6,127,749 | A | | 10/2000 | Sogard ........................ 310/12 |
| 6,144,119 | A | | 11/2000 | Hazelton ..................... 310/12 |
| 6,147,421 | A | | 11/2000 | Takita et al. ................. 310/12 |
| 6,175,169 | B1 | | 1/2001 | Hollis, Jr. et al. ........... 310/12 |
| 6,184,596 | B1 | | 2/2001 | Ohzeki ........................ 310/12 |
| 6,188,147 | B1 | | 2/2001 | Hazelton et al. .............. 310/12 |
| 6,208,045 | B1 | | 3/2001 | Hazelton et al. .............. 310/12 |
| 6,215,260 | B1 | | 4/2001 | Hinds ......................... 318/135 |
| 6,222,614 | B1 | | 4/2001 | Ohtomo ........................ 355/53 |
| 6,252,234 | B1 | | 6/2001 | Hazelton et al. ....... 250/442.11 |
| 6,252,314 | B1 | | 6/2001 | Ebinuma ..................... 310/12 |
| 6,259,174 | B1 | | 7/2001 | Ono ............................ 310/13 |
| 6,262,503 | B1 | | 7/2001 | Liebman ..................... 310/64 |
| 6,271,606 | B1 | | 8/2001 | Hazelton ..................... 310/12 |
| 6,285,097 | B1 | | 9/2001 | Hazelton et al. .............. 310/12 |
| 6,304,320 | B1 | | 10/2001 | Tanaka et al. ................ 355/73 |
| 6,313,550 | B1 | | 11/2001 | Binnard et al. ............... 310/12 |
| 6,316,849 | B1 | | 11/2001 | Konkola et al. .............. 310/12 |
| 6,333,572 | B1 | | 12/2001 | Ono ............................ 310/12 |
| 6,339,266 | B1 | | 1/2002 | Tanaka ........................ 310/12 |
| 6,351,041 | B1 | | 2/2002 | Okubo ........................ 310/12 |
| 6,373,153 | B1 | | 4/2002 | Hazelton et al. .............. 310/12 |
| 6,437,463 | B1 | | 8/2002 | Hazelton et al. .............. 310/12 |
| 6,441,514 | B1 | | 8/2002 | Markle ........................ 310/12 |
| 6,445,093 | B1 | | 9/2002 | Binnard ...................... 310/12 |
| 6,452,292 | B1 | | 9/2002 | Binnard ...................... 310/12 |
| 6,531,793 | B1 | * | 3/2003 | Frissen et al. ................ 310/12 |
| 2001/0020684 | A1 | | 9/2001 | Hazelton ............... 250/442.11 |
| 2001/0023927 | A1 | | 9/2001 | Hazelton ............... 250/442.11 |

FOREIGN PATENT DOCUMENTS

| | | | |
|---|---|---|---|
| JP | 7-67284 | 3/1995 | |
| JP | 11-196560 | 7/1999 | |
| JP | 2000-138279 | 5/2000 | |
| JP | 2000-175434 | 6/2000 | |
| JP | 2000-312465 | 11/2000 | |
| WO | 9806166 | 2/1998 | .......... H02K/41/02 |
| WO | 99/04481 | 1/1999 | |
| WO | 00/03301 | 1/2000 | |
| WO | 00/36734 | 6/2000 | |
| WO | 00/46911 | 8/2000 | |

* cited by examiner

DISPLACEMENT DEVICE

CROSS REFERENCE TO RELATED APPLICATION

This is a continuation of application Ser. No. 09/652,966, filed Aug. 31, 2000, now U.S. Pat. No. 6,531,793 which application claims benfit of European Patent Application No. 99209247.2, filed Sep. 2, 1999.

The invention relates to a displacement device comprising a first part and a second part which can be displaced with respect to each other in at least an X-direction and a Y-direction perpendicularly thereto, the first part comprising a carrier which extends substantially parallel to the X-direction and the Y-direction and on which a system of magnets is secured in accordance with a pattern of rows extending parallel to the X-direction, and columns extending parallel to the Y-direction, an equal distance being present between the rows and between the columns, and magnets of a first type, having a magnetization direction which extends at right angles to the carrier and towards the second part, and magnets of a second type, having a magnetization direction which extends at right angles to the carrier and away from the second part, being alternately arranged in each row and in each column, and a magnet of a third type being arranged in each column between each pair of juxtaposed magnets of the first and the second type, which magnet of a third type has a magnetization direction which extends parallel to the Y-direction and towards the magnet of the first type, while the second part is provided with an electric coil system comprising at least one electric coil of a first type which has current conductors which are situated in a magnetic field of the system of magnets and which include an angle of substantially 45° with the X-direction, and comprising at least one electric coil of a second type, which has current conductors which are also situated in the magnetic field of the system of magnets and which include an angle of substantially 45° with the X-direction, and said current conductors extending perpendicularly to the current conductors of the first electric coil.

Such a displacement device is disclosed in U.S. Pat. No. 5,886,432 and can be used, inter alia, in a wafer stepper for manufacturing integrated circuits. The device enables very accurate and rapid displacements in the X and Y-directions to be made. In addition, small displacements in a Z-direction, perpendicularly to the X and Y-directions, are also possible. The displacements depend upon the phase and the size of the current through the coils. In the system of magnets, a so-called Halbach magnet configuration is employed. In this configuration, the magnets of a series of magnets are magnetized such that the magnetization direction of each magnet of a pair of juxtaposed magnets is rotated through 90° with respect to the other magnet. The use of such a magnet configuration leads to a stronger magnetic field on the side of the coils and hence to larger forces for displacing the parts with respect to each other. In U.S. Pat. No. 5,886,432, a number of adjacent columns of magnets in accordance with the Halbach principle are used. The distance between the columns of magnets is equal to the width of a magnet. Consequently, there is air between the columns.

It is an object of the invention to improve the displacement device in accordance with the first paragraph by optimizing the system of magnets.

To achieve this, the displacement device in accordance with the invention is characterized in that in each row of magnets of the first part, also a magnet of the third type is arranged between each pair of juxtaposed magnets of the first and the second type, which magnet of the third type has a magnetization direction extending parallel to the X-direction and towards the magnet of the first type.

Such a configuration of magnets leads to an even stronger magnetic field per unit of area surface, as compared to that obtained using the system of magnets in accordance with U.S. Pat. No. 5,886,432, because, in accordance with the invention, also in the space between the columns magnets are arranged in accordance with a certain pattern, leading to a more efficient configuration of magnets and hence a stronger magnetic field. In fact, a Halbach configuration of magnets is now obtained both in the X-direction and in the Y-direction.

A further improvement of the displacement device is achieved in that the magnets of the first and the second type have an identical square shape with side faces, in that the magnets of the third type are rectangular in shape with side faces, whereby the longest side faces of a magnet of the third type border on the side faces of a magnet of the first and the second type and are just as long as the side faces of the magnet of the first and the second type, and the ratio of the dimension of the shortest side face of a magnet of the third type to the dimension of the longest side face ranging between 0.25 and 0.50. It has been found that this configuration of magnets yields an even stronger magnetic field.

When the parts are displaced with respect to each other by appropriately leading current through the coils, using commutation of the currents, i.e. a place-dependent current in a current conductor, it has been found that the movable part makes a slightly oscillating movement in the X-Y plane. Although the oscillation is only very small, it can be disturbing in applications for which the displacement device is intended, such as in a wafer stepper, but also in a component placement machine, wherein a high accuracy is required. This is caused by the fact that the distribution of the magnetic field over the current conductor changes during the displacement of the coil, resulting in a variable torque exerted on the current conductor and hence on the second part.

These oscillating movements can be reduced in that the electric coil used in the displacement device in accordance with the invention comprises two sets of coils for each type, which are each fed by an n-phase current system, wherein $n \leq 2$, and wherein, viewed in the longitudinal direction of the current conductors situated in the effective magnetic field, one set of coils is shifted with respect to the other set of coils over a distance approximately equal to half the pole pitch of the magnets, and wherein the pole pitch of the magnets is defined as the distance between two adjacent diagonal lines on which center points of magnets of the same type, i.e. N and Z, are situated. An explanation for this is that the sum of the Lorentz forces in the coils yield only a minimum torque.

It is further advantageous if the length of the current conductors of the coils, which current conductors are situated in the effective magnetic field, is approximately equal to k times the pole pitch of the magnets, with k being 2, 4, 6, . . . , and the pole pitch of the magnets being defined as the distance between two adjacent diagonal lines on which center points of magnets of the same type are situated. A movement in the longitudinal direction of the current conductors causes the sum of the magnetic field to remain substantially constant, as a result of which fluctuations in the strength are reduced.

These and other aspects of the invention will be apparent from and elucidated with reference to the embodiments described hereinafter.

Figure 2:
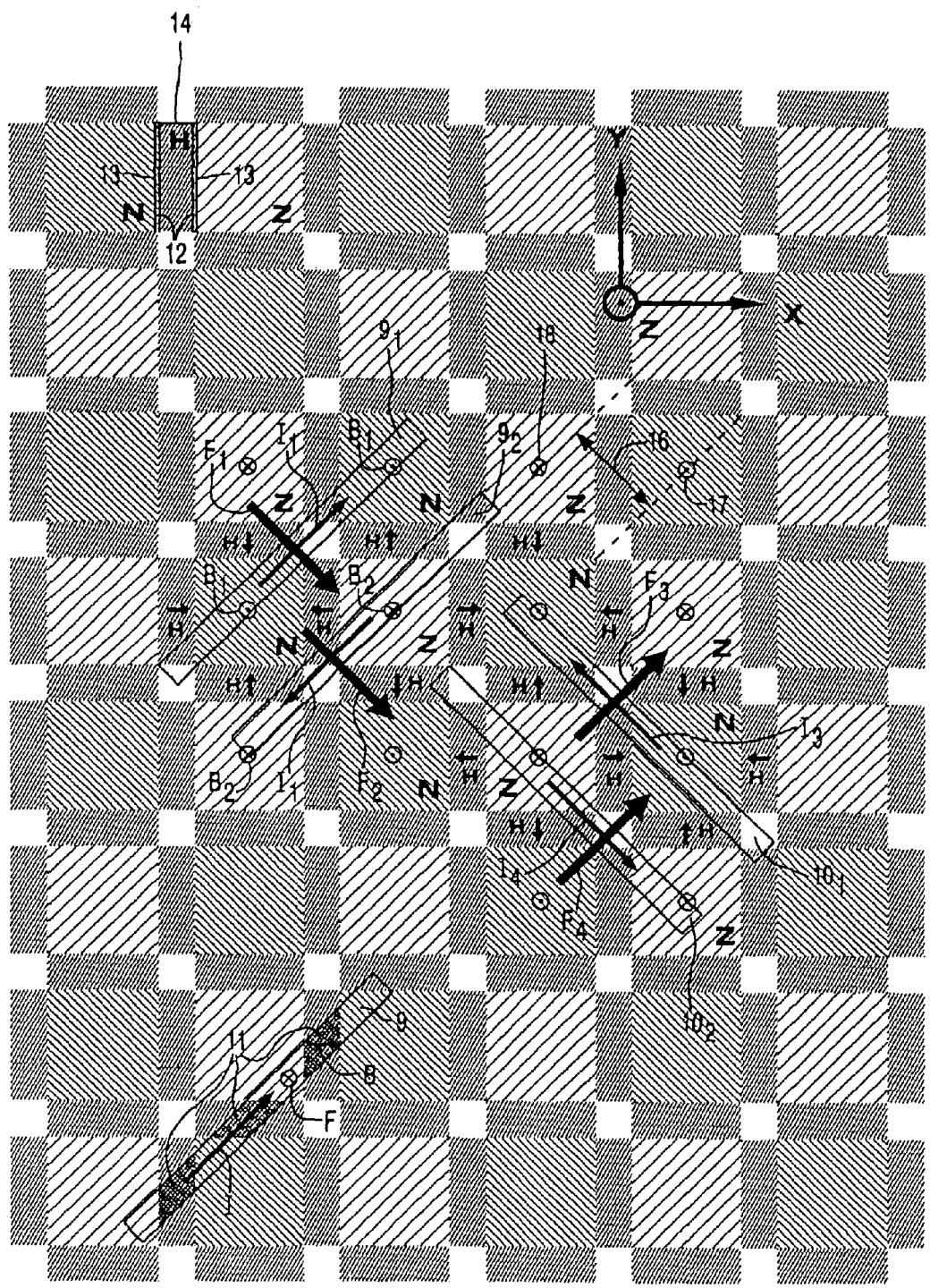
Figure 3:
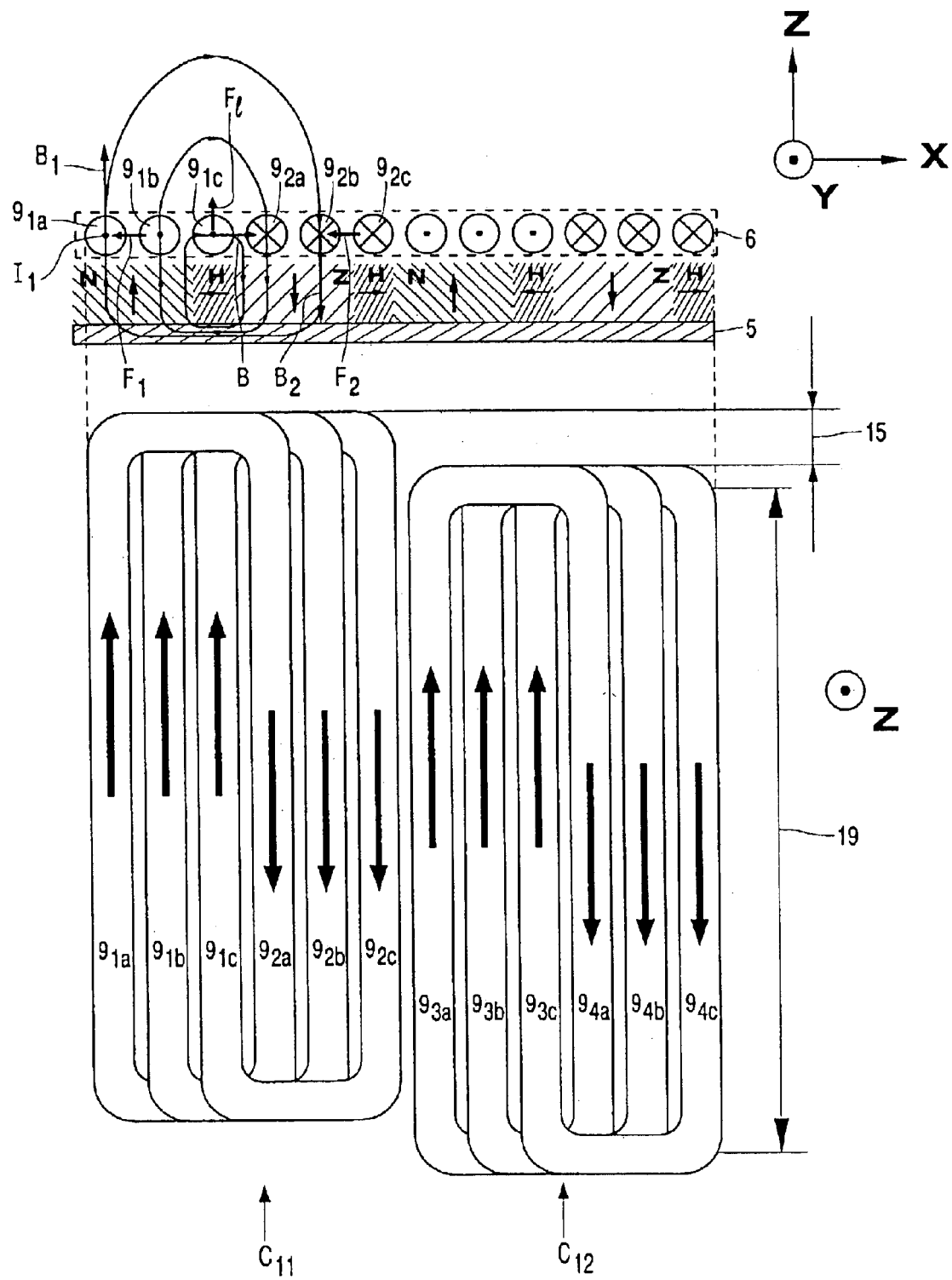
Figure 4:
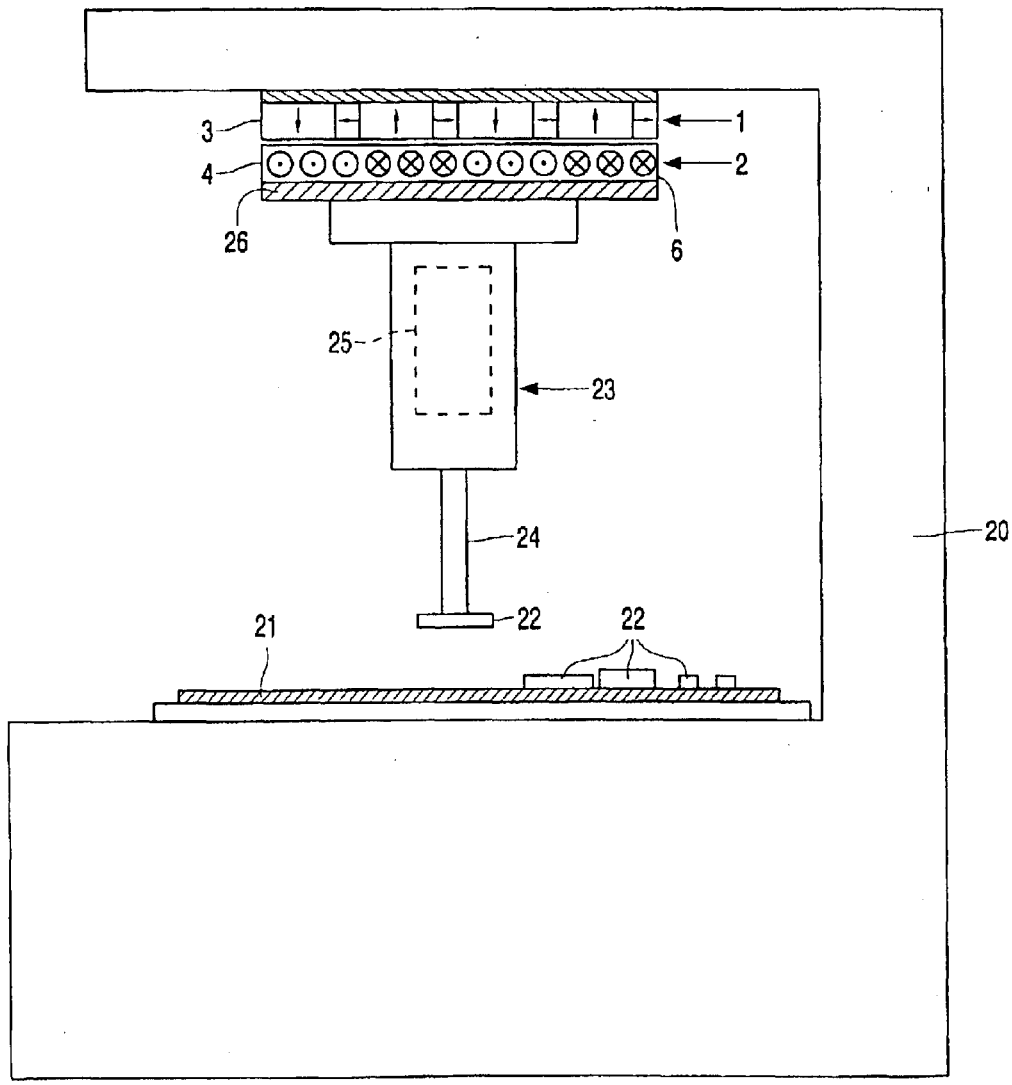
Figure 5:
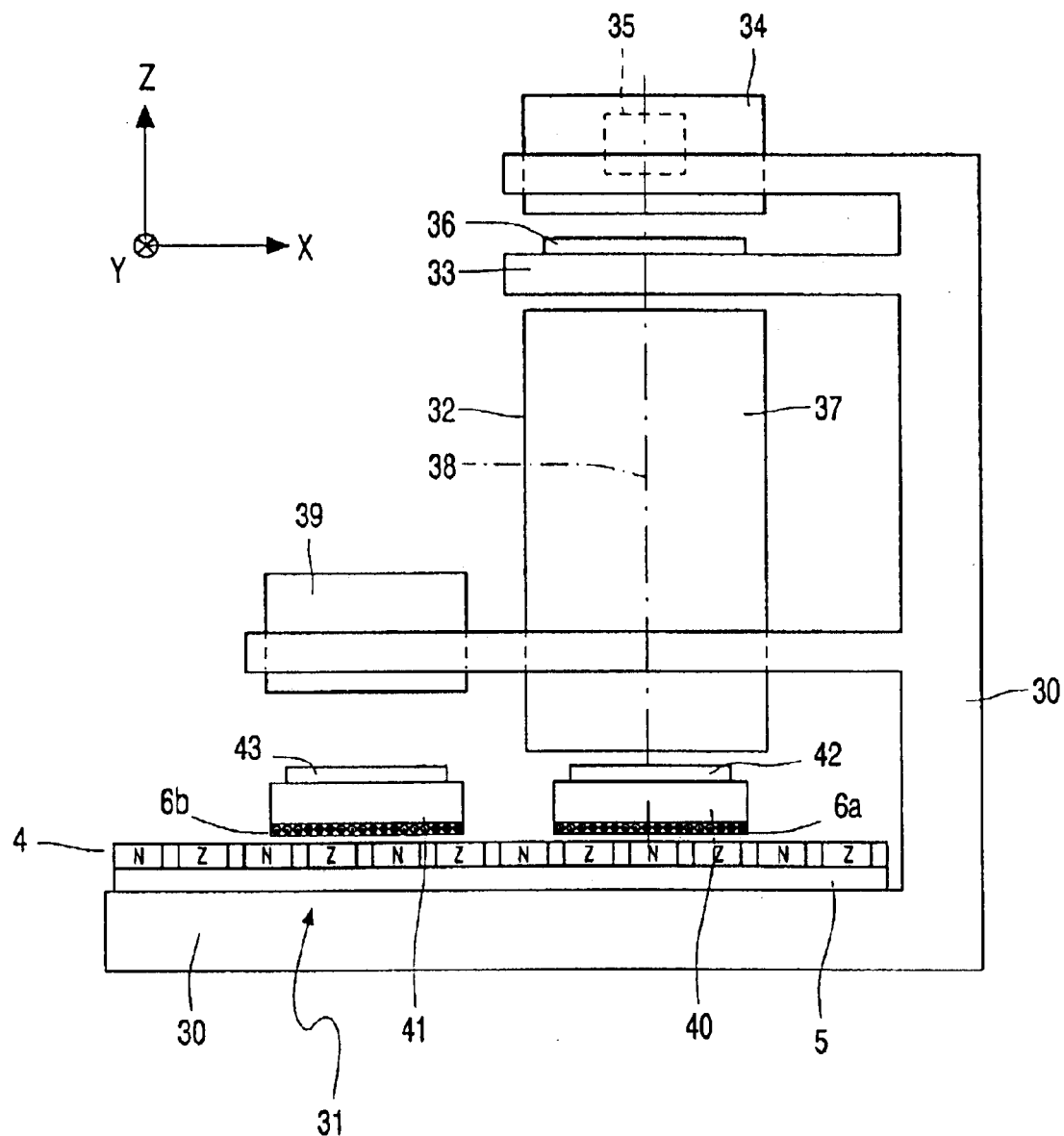

In the drawings:

FIG. 1 is a diagrammatic plan view of the displacement device comprising the system of magnets and the electric coil system, FIG. 2 is a detailed plan view of FIG. 1, FIG. 3 is a cross-sectional view of the displacement device shown in FIG. 1, FIG. 4 shows an example of the application of the displacement device of FIG. 1 in a component placement machine, and FIG. 5 shows an example of the application of the displacement device shown in FIG. 1 in a wafer stepper for the lithographic manufacture of integrated circuits.

FIG. 1 diagrammatically shows a displacement device comprising a first part 1 formed by a system 3 of magnets, and a second part 2 formed by an electric coil system 4. The magnets are secured onto a carrier 5 and the coil system is secured onto a coil block 6. The first and the second part can move with respect to each other. In general, the stationary part is formed by the carrier 5 with the magnets, and the movable part is formed by the coil block 6.

The magnets are arranged on the carrier 5 in the manner described hereinafter: the magnets are arranged in a pattern of rows 7 extending parallel to the X-direction, and columns 8 extending parallel to the Y-direction, the interspace between the rows and between the columns being the same. In each row 7 and in each column 8, magnets of a first type N and of a second type Z are alternately arranged. The magnets of the first type N have a direction of magnetization which extends at right angles to the carrier and towards the second part with the electric coil system, while the magnets of the second type Z have a direction of magnetization which extends at right angles to the carrier and away from the second part with the electric coil system. In each row and in each column, a magnet of a third type H is arranged between each pair of magnets of the first type N and the second type Z. The direction of magnetization of the magnets of the third type H which are situated between the columns 8, extends parallel to the Y-direction and towards the adjacent magnet of the first type N, while the direction of magnetization of the magnets of the third type H which are situated between the rows 7, extends parallel to the X-direction and also towards the adjacent magnet of the first type N. The directions of magnetization of the different types of magnets N, Z and H are indicated by means of arrows.

The electric coil system 4 is provided with at least one coil of a first type $C_1$ whose current conductors 9, which are situated in the effective magnetic field of the magnets, include an angle of 45° with the X-direction, and said electric coil system is also provided with at least one coil of a second type $C_2$ having current conductors 10, which are also situated in the effective magnetic field of the magnets, include an angle of 45° with the X-direction, and extend perpendicularly to the current conductors 9 of the coil of the first type $C_1$. The expression "current conductors in the effective magnetic field", is to be taken to mean that that part of the coil, generally a bunch of current conductors, is situated in the magnetic field of the magnets, and that an effective Lorentz force is exerted on said part, causing a movement of the coil.

The manner in which the coils move in the system of magnets will be explained hereinafter with reference to FIG. 2. The reference numerals $9_1$, $9_2$ and $10_1$, $10_2$ represent current conductors of the coils $C_1$ and $C_2$, respectively, which are provided in the magnetic fields of the magnets. Current conductor $9_1$ is situated predominantly in the magnetic fields of the magnets indicated by means of the letter N. The direction of magnetization of these N magnets is indicated by means of an arrow pointing upwards, i.e. directed at right angles to the system of magnets and towards the current conductor $9_1$. The direction of the magnetic field is indicated by means of the arrow $B_1$. If an electric current flows through the current conductor $9_1$ in the direction indicated by the arrow $I_1$, a force $F_1$ will be exerted on the current conductor in the direction indicated by the relevant arrow, as a result of which the current conductor wants to start moving in the direction of the arrow $F_1$. Current conductor $9_2$ is predominantly situated in the magnetic fields of the magnets referenced Z. The direction of magnetization of these Z magnets is indicated by means of an arrow $B_2$ which points downwards, i.e. at right angles to the system of magnets and away from the current conductor $9_2$. If an electric current flows through the current conductor $9_2$ in accordance with the arrow $I_2$, i.e. it runs counter to the current $I_1$, a force $F_2$ in the direction indicated by the relevant arrow will be exerted on the current conductor $9_2$, as a result of which the current conductor wants to start moving in the direction indicated by the arrow $F_2$, i.e. in the same direction as the arrow $F_1$. In the same manner, the current conductors $10_1$ and $10_2$, which are arranged at right angles to the current conductors $9_1$ and $9_2$, will be subject to a force extending in the direction indicated by the arrows $F_3$ and $F_4$, under the influence of the magnetic fields of the N and Z magnets at a current in accordance with the arrows $I_3$ and $I_4$. Of course, if the currents in the current conductors are reversed, the force exerted on, and hence the movement of the current conductors, will also be reversed. In FIG. 3, this interplay of forces is also shown.

Parts 11 of current conductors 9, 10 are also present above the magnets of the third type H and/or above parts where there is no magnet, i.e. between the magnets of the first type N and the second type Z (see FIG. 2, bottom left). These parts of the current conductors are situated in a magnetic field B whose average direction extends substantially parallel to the X-Y plane. Reference is also made to current conductor $9_{1c}$ in FIG. 3. If a current I runs through this current conductor, the above-mentioned parts of the current conductor will be subject to a force F in a direction perpendicular to the X-Y plane, i.e. the Z-direction. Dependent upon the direction of the current and the position of the current conductor with respect to the magnets, the force will be directed towards the magnets or away from the magnets. If the force is directed away from the magnets, then this force is referred to as the levitation force $F_1$, i.e. a force causing the current conductor to move away from the magnets. Such a force can be used to provide bearing between the coil block and the magnets.

The magnets of the first type N and the second type Z are square in shape. The magnets of the third type H are rectangular and dimensioned so that (see FIG. 2) the longest side faces 12 of a H magnet border on the side faces 13 of an N magnet and a Z magnet, and the ratio between the dimension of the shortest side face 14 and the dimension of the longest side face 12 of a H magnet lies in the range between 0.25 and 0.50. This results, as has been found in an optimization analysis, in the greatest strength of the magnetic field per unit area of the magnet system.

FIG. 3 shows two sets of three coils, i.e. a first set $C_{11}$ with current conductors $9_{1a}$, $9_{1b}$, $9_{1c}$ and return current conductors $9_{2a}$, $9_{2b}$, $9_{2c}$, and a second set $C_{21}$ with current conductors $9_{3a}$, $9_{3b}$, $9_{3c}$ and return current conductors $9_{4a}$, $9_{4b}$, $9_{4c}$. Both sets of coils are fed by a three-phase current system. Viewed in the longitudinal direction of the current conductors, the first set $C_{11}$ of three current conductors is shifted over a distance 15, which is approximately half the pole pitch 16 of the magnets, with respect to the second set $C_{21}$ of three current conductors. The pole pitch 16 of the magnets is to be taken to mean herein the distance between two adjacent diagonal lines on which the center points 17 and 18 of magnets of the same type, respectively, N and Z are situated. If this measure is not taken, a variable torque is exerted on both sets of current-carrying coils during the displacement, which torque causes a kind of oscillating movement of the moving part (coil block or carrier with magnets) around the Z-axis with respect to the stationary part. By virtue of the displacement of the sets of coils with respect to each other, this oscillating effect is substantially reduced because a torque develops in one of the two sets of coils, which compensates for the torque in the other set.

The length 19 of the current conductors is chosen to be such that it is approximately equal to k times the pole pitch 16 of the magnets, k being a multiple of 2. As a result, upon a movement of the current conductor in the longitudinal direction the sum of the magnetic field remains approximately constant. This causes fluctuations in the force exerted on the current conductor to be smaller. This application is not dependent on the coils and phases.

FIG. 4 shows an example of an application of the displacement device in a component placement machine. The stationary part 1 is formed by a carrier 5 on which the system 3 of magnets is arranged, and which is rigidly attached to a machine frame 20. The magnets are downwardly directed, in the direction of a printed circuit board 21 on which components 22 must be placed. Just below the magnets there is the movable part 2 with the coil block 6 on which the coil system 4 is provided. A placement head 23 is attached to the movable part 2. The placement head is provided, for example, with a gripping element or a suction pipette 24 by means of which components can be picked up from a feeder (not shown), whereafter they are placed on the printed circuit board. The placement head may be additionally provided with a separate motor 25 for making a movement in the Z-direction and a rotation about the Z-axis (φ movement). If the current is properly commuted, the placement head can reach any desired position in the X-Y plane and, thus, place a component in the desired position on the printed circuit board. An iron plate 26 is also attached to the coil block 6, as a result of which the coil block 6 is subject to a force in the direction of the magnets. When a current flows through the coils, the levitation force is such that it compensates for the attractive force exerted by the magnets on the iron plate and hence on the coil block. Consequently, when no current flows through the coils, there is no levitation force and the coil block is pulled against the magnets, so that the placement head is automatically attached. As a result, separate bearing and attachment of the placement head is not necessary.

FIG. 5 shows an example of an application of the displacement device in a wafer stepper for the lithographic manufacture of integrated circuits. The wafer stepper comprises a frame 30 for supporting a displacement device 31, a focusing unit 32, a mask holder 33 and a radiation source 34. The radiation source 34 is provided with a light source 35. On the mask holder 33 a mask 36 can be placed, which is provided with a pattern of an integrated semiconductor circuit. The focusing unit is an image or projection system provided with an optical lens system 37 with an optical axis 38. An identification unit 39 is also attached to the frame 30. The displacement device 31 comprises the carrier 5 on which the system of magnets 4 is provided. The carrier 5 is attached to the frame 30. The displacement device further comprises a first and a second coil block 6a and 6b, respectively, which each have a substrate holder 40 and 41, respectively, on which semiconductor substrates 42 and 43, respectively, can be placed. The coil blocks with the substrate holders can be independently sent to any position in the X-Y plane above the system of magnets. This has the advantage that operations, such as moving the substrate holders from and to a load and unload position (not shown), an identification position (below the identification unit 39) and an illumination position (below the focusing unit 32) can be carried out simultaneously and completely independently, so that a larger output is obtained. Also in this construction, the levitation force enables the substrate holder to be bearing-supported with respect to the magnet surface.

What is claimed is:

1. A displacement device comprising a first part and a second part, at least one of which can be displaced with respect to the other in at least an X-direction and a Y-direction perpendicular thereto,
   the part comprising an array of magnets arranged in accordance with a pattern of rows extending parallel to the X-direction and columns extending parallel to the Y-direction, the array of magnets comprising:
   magnets of a first type, having a magnetization direction which extends at right angles to the X- and Y-directions and towards the second part, and magnets of a second type, having a magnetization direction which extends at right angles to the X- and Y-directions and away from the second part, said magnets of a first type and magnets of a second type being alternatively arranged in each row and each column, each of said magnets of the first and second types corresponding to one of the rows and one of the columns, and
   magnets of a third type arranged between each pair of juxtaposed magnets of the first and the second type in each row and column, each magnet of a third type having a magnetization direction which extends in one of the X- and Y-directions,
   wherein each of said magnets of the first and second types has a rectangular cross-section in a first plane extending in the X- and Y-directions, and
   wherein each of said magnets of the third type has a cross-section in the first plane that is different from the cross-section of said magnets of the first and second types.

2. A displacement device as claimed in claim 1, wherein the ratio between the area of said cross-section of said magnets of the third type and the area of said cross-section of said magnets of the first and second types is included in the range of from 0.25 to 0.50.

3. A displacement device as claimed in claim 1,
   wherein the second part includes an array of coils, the array of coils comprising a first set and a second set of coils of a first type and a coil of a second type, and
   wherein the major axes of said coils of the first type are parallel to a first direction and perpendicular to the major axis of the coil of the second type, and
   wherein a position of the first set of coils in a second plane parallel to the first plane is shifted in the first direction with respect to a corresponding position of the second set of coils in the second plane by a distance substantially equal to one-half of the magnet pole pitch,
   the magnet pole pitch being the distance between (1) a first line connecting the center points in the first plane of consecutively adjacent magnets of the first type and (2) a second line connecting the center points in the first plane of consecutively adjacent magnets of the second type that are each juxtaposed to at least one of said consecutively adjacent magnets of the first type.

4. A displacement device as claimed in claim 1,
wherein the second part includes an array of coils comprising a coil of a first type and a coil of a second type, and
wherein the major axis of the coil of the first type is perpendicular to the major axis of the coil of the second type, and
wherein a length of each of said coil of a first type and said coil of a second type, measured along the corresponding major axis, is substantially equal to (2*i* the magnet pole pitch), where i is a positive nonzero integer,
the magnet pole pitch being the distance between (1) a first line connecting the center points in the first plane of consecutively adjacent magnets of the first type and (2) a second line connecting the center points in the first plane of consecutively adjacent magnets of the second type that are each juxtaposed to at least one of said consecutively adjacent magnets of the first type.

5. A placement machine comprising:
a machine frame; and
a placement head configured to place components on a printed circuit board,
wherein the placement head can be displaced using a displacement device as claimed in claim 1, wherein the first part of the displacement device is secured to the machine frame, while the placement head is secured to the second part of the displacement device.

6. The displacement device according to claim 1, wherein said cross-section of said magnets of the third type is rectangular.

7. The displacement device according to claim 1, wherein a ratio between the lengths of two sides of said cross-section of said magnets of the third type is included in the range of from 0.25 to 0.50.

8. The displacement device according to claim 1, wherein said cross-section of said magnets of the first and second types is square.

9. The displacement device according to claim 1, wherein the length of an edge of said cross-section of a magnet of the third type is substantially equal to the length of an adjacent edge of said cross-section of a magnet of one of the first and second types.

10. The displacement device according to claim 1, wherein the lengths in a direction perpendicular to the X- and Y-directions of at least one of the magnets of the first type, at least one of the magnets of the second type, and at least one of the magnets of the third type are substantially equal.

11. The displacement device according to claim 1, wherein the second part is configured to be displaced with respect to the first part in at least the X- and Y-directions while beneath the first part.

12. The displacement device according to claim 1, wherein the second part includes an array of coils.

13. The displacement device according to claim 12, wherein the array of coils is configured to conduct current to exert a corresponding force in a direction perpendicular to a surface of the first part.

14. The displacement device according to claim 13, wherein a ratio between the lengths of two sides of said cross-section of said magnets of the third type is included in the range of from 0.25 to 0.50.

15. The displacement device according to claim 13, wherein the second part is configured to be displaced with respect to the first part in at least the X- and Y-directions while beneath the first part.

16. The displacement device according to claim 12, wherein the array of coils comprises at least one coil of a first type and at least one coil of a second type, and
wherein a line parallel to a major axis of a coil of the first type is perpendicular to a line parallel to a major axis of a coil of the second type.

17. The displacement device according to claim 12, wherein a magnetic plate is attached to the second part, and
wherein the array of coils is positioned between the magnetic plate and the first part.

18. A lithographic apparatus comprising:
a frame;
a mask holder;
a substrate holder; and
a displacement device comprising a first part and a second part, at least one of which can be displaced with respect to the other in at least an X-direction and a Y-direction perpendicular thereto,
the first part comprising are array of magnets arranged in accordance with a pattern of rows extending parallel to the X-direction and columns extending parallel to the Y-direction, the array of magnets comprising:
magnets of a first type, having a magnetization direction which extends at right angles to the X- and Y-directions and towards the second part, and magnets of a second type, having a magnetization direction which extends at right angles to the X- and Y-directions and away from the second part, said magnets of a first type and magnets of a second type being alternately arranged in each row and in each column, each of said magnets of the first and second types corresponding to one of the rows and one of the columns, and
magnets of a third type arranged between each pair of juxtaposed magnets of the first and the second type in each row and column, each magnet of the third type having a magnetization direction which extends in one of the X- and Y-directions,
wherein each of said magnets of the third type has a non-square cross-section in a first plane extending in the X and Y directions, and
wherein each of said magnets of the first and second types has a cross-section in the first plane that is different from the cross-section of said magnets of the third type in the plane, and
wherein one of the first and second parts of the displacement device is secured relative to the frame, and wherein the other of the first and second parts is configured to move one among the mask holder and the substrate holder relative to the frame.

19. The lithographic apparatus according to claim 18, wherein the substrate holder is secured to the second part.

20. The lithographic apparatus according to claim 19, wherein the lithographic apparatus comprises a plurality of substrate holders.

21. The lithographic apparatus according to claim 18, wherein a magnetic plate is attached to the second part.

22. The lithographic apparatus according to claim 18,
wherein the displacement device is configured to move the mask holder relative to the frame, and
wherein the substrate holder is secured to an array of coils movable relative to the frame.

23. The lithographic apparatus according to claim 18, wherein said cross-section of said magnets of the third type is rectangular.

24. The lithographic apparatus according to claim 18, wherein a ratio between the lengths of two sides of said cross-section of said magnets of the third type is included in the range of from 0.25 to 0.50.

25. The lithographic apparatus according to claim 18, wherein said cross-section of said magnets of the first and second types is square.

26. The lithographic apparatus according to claim 18, wherein the length of an edge of said cross-section of a magnet of the third type is substantially equal to the length of an adjacent edge of said cross-section of a magnet of one of the first and second types.

27. The lithographic apparatus according to claim 18, wherein the lengths in a direction perpendicular to the X- and Y-directions of at least one of the magnets of the first type, at least one of the magnets of the second type, and at least one of the magnets of the third type are substantially equal.

28. The lithographic apparatus according to claim 18, wherein the second part is configured to be displaced with respect to the first part in at least the X- and Y-directions while beneath the first part.

29. The lithographic apparatus according to claim 18, wherein the second part includes an array of coils.

30. The lithographic apparatus according to claim 29, wherein the array of coils is configured to conduct current and to exert a corresponding force in a direction perpendicular to a surface of the first part.

31. The lithographic apparatus according to claim 30, wherein a ratio between the lengths of two sides of said cross-section of said magnets of the third type is included in the range of from 0.25 to 0.50.

32. The lithographic apparatus according to claim 30, wherein the second part is configured to be displaced with respect to the first part in at least the X- and Y-directions while beneath the first part.

33. The lithographic apparatus according to claim 29, wherein the array of coils comprises at least one coil of a first type and at least one coil of a second type, and
wherein a line parallel to a major axis of a coil of the first type is perpendicular to a line parallel to a major axis of a coil of the second type.

34. The lithographic apparatus according to claim 29, wherein a magnetic plate is attached to the second part, and
wherein the array of coils is positioned between the magnetic plate and the first part.

35. The lithographic apparatus according to claim 18, said apparatus comprising a projection system configured to project a beam of radiation patterned by a mask held by said mask holder onto a substrate held by said substrate holder.

36. The lithographic apparatus according to claim 35, said apparatus comprising a radiation source configured to provide a beam of radiation that is directed onto a mask held by said mask holder.

37. A displacement device comprising a first part and a second part, at least one of which can be displaced with respect to the other in at least an X-direction and a Y-direction perpendicular thereto,
the first part comprising an array of magnets arranged in accordance with a pattern of rows extending parallel to the X-direction and columns extending parallel to the Y-direction, the array of magnets comprising:
magnets of a first type, having a magnetization direction which extends at right angles to the X- and Y-directions and tow the second part, and magnets of a second type, having a magnetization direction which extends at right angles to the X- and Y-directions and away from the second part, said magnets of a first type and magnets of a second type being alternately arranged in each row and in each column, each of said magnets of the first and second types corresponding to one of the rows and one of the columns, and
magnets of a third type arranged between each pair of juxtaposed magnets of the first and the second type in each row and column, each magnet of the third type having a magnetization direction which extends in one of he X- and Y-directions,
wherein each of said magnets of the third type has a non-square cross-section in a first plane extending in the X and Y directions, and
wherein each of said magnets of the first and second types has a cross-section in the first plane that is different from the cross-section of said magnets of the third type in the plane.

38. The displacement device according to claim 37, wherein the ratio between the area of said cross-section of said magnets of the third type and the area of said cross-section of said magnets of the first and second types is included in the range of from 0.25 to 0.50.

39. The displacement device according to claim 37, wherein the second part includes an array of coils, the array of coils comprising a first set and a second set of coils of a first type and a coil of a second type, and
wherein the major axes of aid coils of the first type are parallel to a first direction and perpendicular to the major axis of the coil of the second type, and
wherein a position of the first set of coils in a second plane parallel to the first plane is shifted in the first direction with respect to a corresponding position of the second set of coils in the second plane by a distance substantially equal to one-half of the magnet pole pitch,
the magnet pole pitch being the distance between (1) a first line connecting the center points in the first plane of consecutively adjacent magnets of the first type and (2) a second line connecting the center points in the first plane of consecutively adjacent magnets of the second type that are each juxtaposed to at least one of said consecutively adjacent magnets of the first type.

40. The displacement device according to claim 37, wherein the second part includes an array of coils comprising a coil of a first type and a coil of a second type, and
wherein the major axis of the coil of the first type is perpendicular to the major axis of the coil of the second type, and
wherein a length of each of said coil of a first type and said coil of a second type, measured along the corresponding major axis, is substantially equal to (2*i* the magnet pole pitch), where i is a positive nonzero integer,
the magnet pole pitch being the distance between (1) a first line connecting the center points in the first plane of consecutively adjacent magnets of the first type and (2) a second line connecting the center points in the first plane of consecutively adjacent magnets of the second type that are each juxtaposed to at least one of said consecutively adjacent magnets of the first type.

41. The displacement device according to claim 37, wherein said cross-section of said magnets of the third type is rectangular.

42. The displacement device according to claim 37, wherein a ratio between the lengths of two sides of said cross-section of said magnets of the third type is included in the range of from 0.25 to 0.50.

43. The displacement device according to claim 37, wherein said cross-section of said magnets of the first and second types is square.

44. The displacement device according to claim 37, wherein the length of an edge of said cross-section of a magnet of the third type is substantially equal to the length of an adjacent edge of said cross-section of a magnet of one of the first and second types.

45. The displacement device according to claim 37, wherein the lengths in a direction perpendicular to the X- and Y-directions of at least one of the magnets of the first type, at least one of the magnets of the second type, and at least one of the magnets of the third type are substantially equal.

46. The displacement device according to claim 37, wherein the second part is configured to be displaced with respect to the first part in at least the X- and Y-directions while beneath the first part.

47. The displacement device according to claim 37, wherein the second part includes an array of coils.

48. The displacement device according to claim 37, wherein the array of coils is configured to conduct current and to exert a corresponding force in a direction perpendicular to a surface of the first part.

49. The displacement device according to claim 48, wherein a ratio between the lengths of two sides of said cross-section of said magnets of the third type is included in the range of from 0.25 to 0.50.

50. The displacement device according to claim 48, wherein the second part is configured to be displaced with respect to the first part in at least the X- and Y-directions while beneath the first part.

51. The displacement device according to claim 47, wherein the array of coils comprises at least one coil of a first type and at least one coil of a second type, and wherein a line parallel to a major axis of a coil of the first type is perpendicular to a line parallel to a major axis of a coil of the second type.

52. The displacement device according to claim 47, wherein a magnetic plate is attached to the second part, and wherein the array of coils is positioned between the magnetic plate and the first part.

53. A lithographic apparatus comprising:

a frame;

a mask holder;

a substrate holder; and a displacement device comprising a first part and a second part, at least one of which can be displaced with respect to the other in at least an X-direction and a Y-direction perpendicular thereto, the first part comprising an array of magnets arranged in accordance with a pattern of rows extending parallel to the X-direction and columns extending parallel to the Y-direction, the array of magnets comprising:

magnets of a first type, having a magnetization direction which extends at right angles to the X- and Y-directions and towards the second part, and magnets of a second type, having a magnetization direction which extends at right angles to the X- and Y-directions and away from the second part, said magnets of a first type and magnets of a second type being alternately arranged in each row and in each column, each of said magnets of the first and second types corresponding to one of the rows and one of the columns, and magnets of a third type arranged between each pair of juxtaposed magnets of the first and the second type in each row and column, each magnet of the third type having a magnetization direction which extends in one of the X- and Y-directions, wherein each of said magnets of the third type has a non-square cross-section in a first plane extending in the X and Y directions, and wherein each of said magnets of the first and second types has a cross-section in the first plane that is different from the cross-section of said magnets of the third type in the plane, and wherein one of the first and second parts of the displacement device is secured relative to the frame, and wherein the other of the first and second parts is configured to move one among the mask holder and the substrate holder relative to the frame.

54. The lithographic apparatus according to claim 53, wherein the substrate holder is secured to the second part.

55. The lithographic apparatus according to claim 54, wherein the lithographic apparatus comprises plurality of substrate holders.

56. The lithographic apparatus according to claim 53, wherein a magnetic plate is attached to the second part.

57. The lithographic apparatus according to claim 53, wherein the displacement device is configured to move the mask holder relative to the frame, and wherein the substrate holder is secured to an array of coils movable relative to the frame.

58. The lithographic apparatus according to claim 53, said apparatus comprising a projection system configured to project a beam of radiation patterned by a mask held by said mask holder onto a substrate held by said substrate holder.

59. The lithographic apparatus according to claim 58, said apparatus comprising a radiation source configured to provide a beam of radiation that is directed onto a mask held by said mask holder.

60. The lithographic apparatus according to claim 53, wherein said cross-section of said magnets of the third type is rectangular.

61. The lithographic apparatus according to claim 53, wherein a ratio between the lengths of two sides of said cross-section of said magnets of the third type is included in the range of from 0.25 to 0.50.

62. The lithographic apparatus according to claim 53, wherein said cross-section of said magnets of the first and second types is square.

63. The lithographic apparatus according to claim 53, wherein the length of an edge of said cross-section of a magnet of the third type is substantially equal to the length of an adjacent edge of said cross-section of a magnet of one of the first and second types.

64. The lithographic apparatus according to claim 53, wherein the lengths in a direction perpendicular to the X- and Y-directions of at least one of the magnets of the first type, at least one of the magnets of the second type, and at least one of the magnets of the third type are substantially equal.

65. The lithographic apparatus according to claim 53, wherein the second part is configured to be displaced with respect to the first part in at least the X- and Y-directions while beneath the first part.

66. The lithographic apparatus according to claim 53, wherein the second part includes an array of coils.

67. The lithographic apparatus according to claim 66, wherein the array of coils is configured to conduct current and to exert a corresponding force in a direction perpendicular to a surface of the first part.

68. The lithographic apparatus according to claim 67, wherein a ratio between the lengths of two sides of said cross-section of said magnets of the third type is included in the range of from 0.25 to 0.50.

69. The lithographic apparatus according to claim 67, wherein the second part is configured to be displaced with respect to the first part in at least the X- and Y-directions while beneath the first part.

70. The lithographic apparatus according to claim 66, wherein the array of coils comprises at least one coil of a first type and at least one coil of a second type, and wherein a line parallel to a major axis of a coil of the first type is perpendicular to a line parallel to a major axis of a coil a the second type.

71. The lithographic apparatus according to claim 66, wherein a magnetic plate is attached to the second part, and wherein the array of coils is positioned between the magnetic plate and the first part.

* * * * *